United States Patent [19]

Yves et al.

[11] Patent Number: 4,696,094
[45] Date of Patent: Sep. 29, 1987

[54] PROCESS OF MANUFACTORING AN INDIUM ANTIMONIDE PHOTODIODE

[75] Inventors: Henry Yves; André Nicollet; Michel Villard, all of Paris, France

[73] Assignee: Thomson - CSF, Paris, France

[21] Appl. No.: 676,622

[22] Filed: Nov. 30, 1984

[30] Foreign Application Priority Data

Dec. 2, 1983 [FR] France .................. 83 19317

[51] Int. Cl.$^4$ .................................. H01L 21/18
[52] U.S. Cl. ........................ 437/23; 250/492.2; 437/80; 437/906
[58] Field of Search ............. 29/572, 576 B, 589, 29/591, 578; 148/1.5; 427/38, 85; 357/91, 30; 250/492.2

[56] References Cited

U.S. PATENT DOCUMENTS 3,577,175  5/1971  Gri et al. .................. 357/30
3,649,369  3/1972  Hunsperger .
4,286,277  8/1981  Longshore .

FOREIGN PATENT DOCUMENTS 2316727  1/1977  France .

OTHER PUBLICATIONS

Belotelov et al, "Doping of P-Type InSb with Hot Sulfur Ions (Properties of P-N Junctions)", Sov. Phys. Semicond., 17(11), Nov. 1983, pp. 1230–1232.

Korshunov et al, "Investigation of Isothermal Annealing of Indium Antimonide Irradiated with Moderate Energy Ions", Sov. Phys. Semicond. 13(4), Apr. 1979, pp. 380–381.

McNally, "Ion Implantation in InAs and InSb", Radiation Effects, 1970, vol. 6, pp. 149–153.

Korshunov, "Ellysometric Investigation of Indium Antimonide Bombarded with Moderate-Energ Ions", Sov. Phys. Semicond. 13(9), Sep. 1979, pp. 1074–1075.

Korshunov et al, "Anomalously Accelerated Diffusion of Sulfur in Implanted P-Type In Sb", Sov. Phys. Semicond. 16(8), Aug. 1982, pp. 964–965.

Primary Examiner—Brian E. Hearn
Assistant Examiner—John I. Callahan
Attorney, Agent, or Firm—Roland Plottel

[57] ABSTRACT

A method for forming indium antimonide photodiodes by ionic implantation of the $S_{34}{}^+$ isotope of sulphur on a p type indium antimonide substrate. These photodiodes may be readily coupled to an N channel charge transfer device which provides multiplexing of the photodiodes and readout of the charges.

6 Claims, 10 Drawing Figures

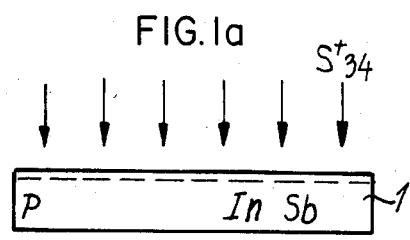
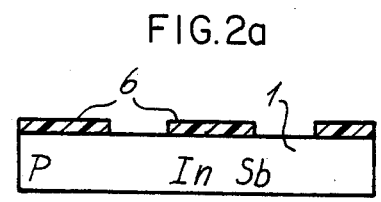
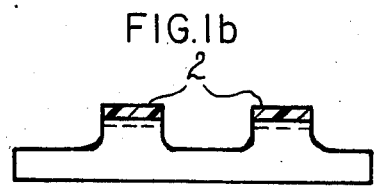
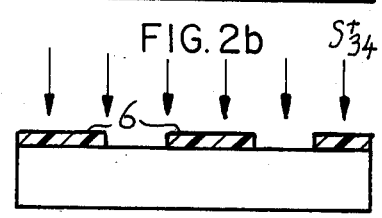
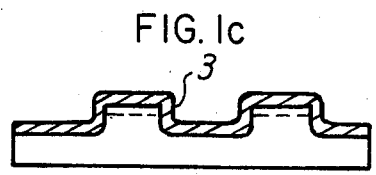
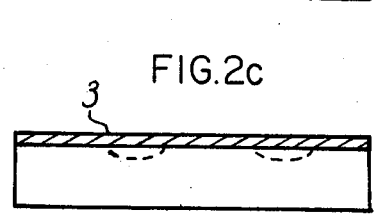
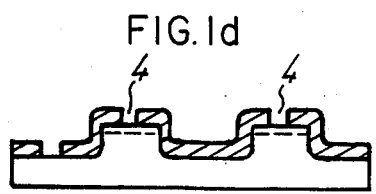
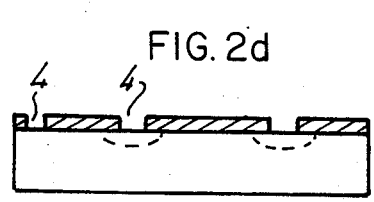
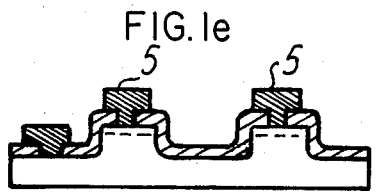
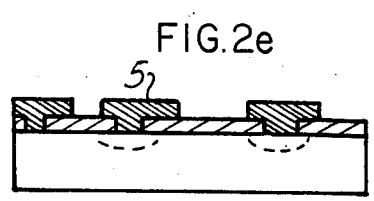

PROCESS OF MANUFACTORING AN INDIUM ANTIMONIDE PHOTODIODE

BACKGROUND OF THE INVENTION

1. Field of the Invention

The present invention relates to indium antimonide photodiodes. It also relates to the different methods for manufacturing these photodiodes.

The present invention aims at solving the following problem:

on the one hand, construction of photodiodes for infrared operation on an indium antimonide semiconductor substrate;

on the other hand, coupling of these photodiodes with a charge transfer device for multiplexing the photodiodes and reading out the charges; this device is formed on a semiconductor substrate, generally made from silicon, and has an N channel. The use of an N channel device, formed on a P type substrate, allows very good charge injection efficiency to be obtained as well as high mobility of the minority carriers of the device which are electrons.

2. Description of the Prior Art

Reference may be had for example to the article published in the review I.E.E.E. volume ED 27, No. 1, January 1980, pages 175 to 188, which is entitled "CCD Readout of infrared hybrid focal-plane arrays". This article shows an N channel charge transfer device coupled to a photodiode—see FIGS. 2 and 5 and the corresponding comments.

In the prior art, photodiodes were formed on an N type indium antimonide substrate. For connecting these photodiodes to an N channel charge transfer device, an additional current source had to be used as is described in French patent application No. 81.12841 in the name of Thomson-CSF. In fact, in the case of a photodiode network formed on an N type substrate, the N substrate is common to all the photodiodes and only the P regions of the photodiodes may be connected to the N channel of the charge transfer device. As is explained in the above mentioned patent, in this case the charges coming from the photodiodes are of the opposite sign to those transferred into the charge transfer device. An additional current source has therefore to be used which injects into the charge transfer device a current which may be written: a−s, where a is a current supplied by the source and s the current coming from a photodiode.

These additional current sources are difficult to construct and complicate the assembly of the device.

The present invention overcomes the above mentioned problem in a simple and efficient way.

SUMMARY OF THE INVENTION

The present invention relates to an indium antimonide photodiode, comprising on a P type, indium antimonide substrate, an ionic implantation of the $S_{34}^+$ isotope of sulphur.

The photodiodes of the invention may be readily connected to an N channel charge transfer device. These photodiodes are formed on a P type substrate which is common to all the photodiodes and it is therefore their N region which is connected to the N channel of the charge transfer device, without an additional current source being required, since the charges coming from the photodiodes are of the same sign as those transferred into the charge transfer device.

It should be noted that the photodiodes of the invention are delicate to construct. In particular, it is not possible to obtain photodiodes on a P type indium antimonide substrate by diffusion.

Finally, it should be noted that the $S_{34}^+$ isotope of sulphur is used for the ionic implantation. This is one of the four isotopes of sulphur among which we find the $S_{32}$, $S_{33}$ and $S_{36}$ isotopes. The $S_{34}$ isotope only represents 4.22% by weight of the sulphur. The use of this isotope avoids implanting too much oxygen at the same time as the sulphur is implanted. If the $S_{32}$ isotope is used, which is more abundant, much more oxygen is implanted at the same time as the sulphur. This is due to the fact that 99.76% of oxygen exists in the $O_{16}$ isotope form, which gives, for an oxygen molecule, $O_{32}$ oxygen likely to be implanted at the same time as the $S_{32}$ sulphur; whereas there only exists 0.04% of oxygen in $O_{17}$ isotope form, giving $O_{34}$ oxygen for the oxygen molecule and $O_{34}$ oxygen may be obtained by combination of $O_{16}$ oxygen and $O_{18}$ oxygen but only to the amount of 0.2% of oxygen, now it is this $O_{34}$ oxygen which is likely to be implanted at the same time as the $S_{34}$ sulphur.

BRIEF DESCRIPTION OF THE DRAWINGS

Other objects, features and results of the invention will be clear from the following description given by way of non limitative example and illustrated by the accompanying FIGS. 1a to 1e and 2a to 2e which show the different steps of the methods for manufacturing photodiodes according to the invention.

In the different Figures, the same references designate the same elements but, for the sake of clarity the sizes and proportions of different elements have not been respected.

DESCRIPTION OF THE PREFERRED EMBODIMENTS

In FIGS. 1a to 1e are shown the different steps in the manufacture of a photodiode in accordance with the invention.

In FIG. 1a, a type P semiconductor substrate 1 made from indium antimonide In Sb is provided. This substrate is doped to the order of $10^{15}$ to $10^{16}$ atoms per cubic centimeter.

Ions of the $S_{34}^+$ isotope of sulphur are implanted in the substrate, which is symbolized by vertical arrows in FIG. 1a, with an energy of the order of 100 to 200 KeV at a temperature of the order of 20° to 150° C. The implantation dose is of the order of $5 \times 10^{13}$ to $10^{15}$ atoms per square centimeter.

Once the implantation is finished the substrate is heated to a temperature between 350° and 400° C. for a time of the order of 35 to 50 minutes. To avoid decomposition of the indium antimonide, heating takes place under encapsulation or "capless", that is to say that the indium antimonide substrate is placed between two well polished silicon plates in intimate contact with the indium antimonide substrate.

The sulphur acts as electron giver and causes the creation of an N type zone symbolized by broken lines in the Figures. Thus a photovoltaic junction is obtained. The heating rearranges the structure of the material which is disturbed over a thickness of about 1000 to 3000 Å.

The heating places the sulphur atoms in the gaps of the antimony.

Then—see FIG. 1b—the surface of each photodiode is determined by photolithographic etching. The etching may for example be chemical, or electro-chemical, or ionic.

In FIG. 1b has been shown a mesa structure device. The positive or negative photosensitive resin layers 2 protect the surface reserved for each photodiode.

Then—see FIG. 1c—a dielectric layer 3 is deposited. The dielectric may be deposited by anode oxidation, by vacuum evaporation, by coating or by sputtering for example. It may be a mineral or organic dielectric. Thus silicon oxide SiO may be deposited by evaporation.

In FIG. 1d it can be seen that windows 4 are opened for establishing contacts with the P type substrate and with the N type implantations.

In FIG. 1e, electric contacts 5 are deposited, made from metal for example, in windows 4.

In FIGS. 2a to 2e, the different steps have been shown of another method for manufacturing photodiodes in accordance with the invention.

In FIG. 2a the position of the photodiodes is defined by photoetching by removing a photosensitive resin layer 6 at the locations reserved for the detectors, thus the ionic implantation is limited to only the zones selected. In place of the resin a layer of "hard" dielectric material may be used which does not let the sulphur ions pass therethrough, this is the case for silicon oxide SiO. A planar structure is therefore used.

In FIG. 2b, $S_{34}^+$ ions are implanted under the same conditions as for the method of FIG. 1. The ions are received over the whole surface carrying the photodiodes.

Then the substrate is heated as in the method shown in FIGS. 1a to e.

In FIG. 2c, it is shown that the resin (or "hard" dielectric material) was eliminated and that a dielectric layer 3 was deposited over the whole surface as in FIG. 1c.

In FIG. 2d, windows 4 are formed and in FIG. 2e contacts 5 are placed in these windows.

It should be noted that in FIGS. 2a to 2e, a planar structure is shown.

In the case of method of FIGS. 1a to e, during the step shown in FIG. 1a, the whole of the substrate is implanted. To form an array or matrix of photodiodes, a mesa structure must be used for defining the photodiodes. On the other hand, if it is desired to form only a single photodiode, a planar structure can be used in the method shown in FIGS. 1a to e which begins by implantation.

In the case of the method shown in FIGS. 2a to e, a mesa structure can be used. After implantation and heating as in FIG. 2b, the mesas must be formed around the implanted zones.

What is claimed is:

1. A method for manufacturing an indium antimonide photodiode having an ionic implantation of the $S_{34}^+$ isotope of sulphur on a P type indium antimonide substrate which comprises providing an ionic implantation consisting essentially of the $S_{34}^+$ isotope of sulphur on a P type indium antimonide substrate then in heating the implanted substrate.

2. The method as claimed in claim 1, wherein:
doping of the P type indium antimonide substrate with p type impurities is of the order of $10^{15}$ to $10^{16}$ atoms per cubic centimeter;
the implantation of $S_{34}^+$ ions takes place with an energy of the order of 100 to 200 KeV, at a temperature of the order of 20° to 150° C. and the implantation dose is of the order of $5 \times 10^{13}$ to $10^{15}$ atoms per square centimeter;
heating takes place under encapsulation at a temperature between 350° to 400° C. and for a period of about 35 to 50 minutes.

3. The method as claimed in claim 1, wherein:
implantation and heating of the substrate are effected;
the surface reserved for each photodiode is defined by depositing and patterning a mask layer and etching the exposed substrate thus forming a mesa structure;
a dielectric layer is deposited over the whole surface;
windows are opened in the dielectric layer to said substrate and electric contacts are deposited.

4. The method as claimed in claim 1, wherein:
the surface reserved for each photodiode is defined by depositing and patterning a mask layer, thus forming a planar structure;
said implantation and said heating of the substrate are effected, the zones to be implanted being defined by photosensitive resin or a dielectric material;
a dielectric layer is deposited over the whole surface;
windows are opened in the dielectric layer to said substrate and electric contracts are deposited.

5. The method as claimed in claim 2, wherein:
the said implantation and said heating of the substrate are effected;
the surface reserved for each photodiode is defined by fabricating a mask and etching the exposed substrate thus forming a mesa structure;
a dielectric layer is deposited over the whole surface;
windows are opened in the dielectric layer to said substrate and electric contracts are deposited.

6. The method as claimed in claim 2, wherein:
the surface reserved for each photodiode is defined by depositing and patterning a mask layer, thus forming a planar structure;
said implantation and said heating of the substrate are effected, the zones to be implanted being defined by photosensitive resin or a dielectric material;
a dielectric layer is deposited over the whole surface;
windows are opened in the dielectric layer to said substrate and electric contacts are deposited.

* * * * *